United States Patent
Anderson et al.

(10) Patent No.: US 7,463,056 B1
(45) Date of Patent: Dec. 9, 2008

(54) WRITEABLE SHIFT REGISTER LOOKUP TABLE IN FPGA WITH SRAM MEMORY CELLS IN LOOKUP TABLE REPROGRAMMED BY WRITING AFTER INITIAL CONFIGURATION

(75) Inventors: James B. Anderson, Santa Cruz, CA (US); Sean W. Kao, Campbell, CA (US); Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 399 days.

(21) Appl. No.: 11/301,056

(22) Filed: Dec. 12, 2005

(51) Int. Cl.
*H03K 19/173* (2006.01)

(52) U.S. Cl. .......................................... 326/38; 326/41

(58) Field of Classification Search ............... 326/37–50
See application file for complete search history.

(56) References Cited

U.S. PATENT DOCUMENTS

| 5,559,450 | A | 9/1996 | Ngai et al. |
| 5,889,413 | A | 3/1999 | Bauer |
| 6,497,370 | B1 * | 12/2002 | Moreaux ..................... 235/492 |
| 6,807,123 | B2 * | 10/2004 | Kaiser et al. ............. 365/225.7 |

* cited by examiner

*Primary Examiner*—Don P Le
(74) *Attorney, Agent, or Firm*—Thomas A. Ward

(57) ABSTRACT

An FPGA system includes a combined shift register and look up table (LUT) forming a shift register LUT (SRL) that provides data write, reset and shift enable on a cell-by-cell basis. The data write and reset can be performed during FPGA operation without requiring a number of frames or columns of configuration memory cells to be reprogrammed, as with conventional SRAM cells. The shift enable provides for synchronization to facilitate the cell-by-cell write and reset.

19 Claims, 8 Drawing Sheets

WRITEABLE SHIFT REGISTER LOOKUP TABLE IN FPGA WITH SRAM MEMORY CELLS IN LOOKUP TABLE REPROGRAMMED BY WRITING AFTER INITIAL CONFIGURATION

BACKGROUND

1. Technical Field

Embodiments of the present invention relate to programmable logic devices (PLDs) that include programmable shift registers. More particularly, embodiments of the present invention relate to field programmable gate arrays (FPGAs) that include look up tables (LUTs) configured to form shift registers, the structures referred to as shift register LUTs (SRLs).

2. Related Art

An FPGA is an integrated circuit chip which includes components such as programmable input/output buffers (IOBs), configurable logic blocks (CLBs), block random access memory (BRAMs) and a programmable interconnect circuitry for interconnecting the IOBs, CLBs and BRAMs. The FPGAs further include SRAM configuration memory cells that can be programmed to configure the logic in the IOBs, CLBs and BRAMs. The SRAM configuration memory cells are typically programmed at startup of the FPGA, but can be reprogrammed using a partial reconfiguration process during operation of the FPGA by programming frames or a number of columns of the SRAM memory cells at a time.

The CLBs include a number of LUTs typically made up of components such as multiplexers and SRAM memory cells. At configuration, a bitstream is provided to program the individual SRAM memory cells to set the state of each LUT with a desired function by writing the truth table of the desired function to the individual SRAM memory cells. Each LUT implements a logic function with n inputs that select an output depending on how the SRAM memory cells are programmed or configured. Logic functions may use all n inputs to the logic element or may use only a subset thereof. A few of the possible logic functions that an LUT can implement are: AND, OR, XOR, NAND, NOR, XNOR and mixed combinations of these functions.

FIG. 1 shows one SRAM memory cell structure for use in a LUT. The memory cell 2 includes a latch 4 formed by series inverters that are programmed by applying the value to the source-drain path of a transistor 6 on the data input bit line, "Data," and strobing the corresponding gate with an address "Address," or word line signal. Although this architecture uses five transistors, other known SRAM configurations, e.g., six transistor static memory cells, also are appropriate choices for implementing the memory cells of the LUT. As shown in FIG. 1, inverter 8 may be included to increase the drive of memory cell 2.

FIG. 2 shows an alternative embodiment to memory cell structure of a LUT of FIG. 1 with the memory cell modified to include an additional programming transistor 7 to provide complementary programming data inputs BIT and BITB, as well as an additional output inverter 9 to provide complementary outputs Q and QB. Components carried over from FIG. 1 into subsequent figures are similarly labeled in FIG. 2, as will be components carried forward in subsequent drawings.

FIG. 3 shows a block diagram of components making up a two input LUT that includes four memory cells 10 and drivers 11 connecting to a multiplexer 12, each memory cell 10 and driver 11 with memory cells having a structure such as shown in either of FIG. 1 or FIG. 2. After configuration of the memory cells 10, to use a LUT of FIG. 2 the input lines act as address lines $I_0$ and $I_1$ which select a corresponding memory cell 10 in the LUT. For example, a LUT configured to implement a two-input NAND gate would output the corresponding value {1, 1, 1, or 0} contained in the one of the four memory cells 10 corresponding to the current input pair {00, 01, 10, 11}, respectively. This selection is performed by a decoding multiplexer 12 which selects a memory cell 10 on the basis of the logic levels of the input lines $I_1$ and $I_1$. The multiplexer 12 propagates a value stored in one of the memory cells 10 to an output OUT of the lookup table as selected by the input signals $I_0$ and $I_1$.

FIG. 4 illustrates circuitry that can be provided with the memory cell 20 of either FIGS. 1 and 2 to create a shift register mode, enabling a value to be shifted from a proceeding memory cell into a subsequent cell in a LUT to form a SRL. The additional circuitry includes pass transistors 14 and 22 to shift data in and out to set the state of latch 4. The pass transistor 14 provides a data signal to latch 4 and has a source-drain path connecting to the QB input of latch 4. The pass transistor 22 is connected between latch 4 and output inverter 8 to apply the state of latch 4 to a subsequent memory cell. The pass transistor 14 receives a gate shift signal SHIFT1 in conjunction with a gate shift signal SHIFT2 applied to pass transistor 22. The shift signal SHIFT1 is provided 180 degrees out of phase with the shift signal SHIFT2 to accomplish shifting data through a register formed by a number of chained memory cells, such as the cell shown in FIG. 4. An inverter 24, similar to inverter 8 following memory cell 20, is attached to the preceding memory cell from cell 20 to shift in data. The inverter 24 is designed to overpower the inverters of latch 4 so that values can be shifted between adjacent memory cells. Therefore, the current value stored in each memory cell is overwritten by the output of the previous memory cell. Interconnected memory cells as shown in FIG. 4 can be used to form the memory cells of a LUT connected as shown in FIG. 3 to form a SRL.

FIG. 5 illustrates LUT memory cells configured to form a shift register, with complementary data being shifted in and out. Two memory cells 30 and 32 are shown connected together. The memory cells 30 and 32 each include the latch 4, and a first pass transistor 14, similar to the cell of FIG. 4. The first pass transistor 14 has a source-drain path connected to the Q output of the latch 4, while an additional pass transistor 15 is added to the memory cells 30 and 32 in FIG. 6 with a source-drain path connecting a previous memory cell output to the QB input of latch 4. The transistors 14 and 15, thus, provide complementary inputs, and both have a gate receiving the SHIFT1 input signal. Further in FIG. 5, a pass transistor 23 is added in addition to pass transistor 22 to provide complementary outputs in response to a gate signal SHIFT2. Pass transistors 22 and 23 in combination with latches 8 and 9 form a dynamic latch.

The circuitry shown in FIGS. 1-5, and described herein are generally described in U.S. Pat. No. 5,889,413 to Bauer, entitled "Lookup Tables Which Double As Shift Registers," and incorporated by reference herein in its entirety.

SRLs provide general purpose shift register structures on FPGAs and are widely used in FSM-based controls, delay pipelines, FIR/IIR filters, etc. For the specific case of SRL, efficient implementation hinges upon re-use of configuration resources. For SRAM-based FPGAs, configuration is typically expressed in terms of SRAM-cell contents. Unfortunately, these cells are not usually bit-addressable during either initial configuration or partial reconfiguration. Thus, any associated programming operations are typically performed using the smallest addressable region, which may be a frame or multiple columns of bits. To maintain a state management control of changes to individual memory cell bits requires storage of data for all the frames that must be reprogrammed at one time. Programming operations are, thus, typically time consuming, even when partial reconfiguration of less than all frames is performed.

SUMMARY

According to embodiments of the present invention a data write path port, a reset port and a shift enable port are provided on memory cells of an SRL. The data write port is provided with circuitry that enables write, reset and shift enabling to be performed on a cell-by-cell basis during FPGA operation without requiring a number of frames or columns of configuration memory cells to be reprogrammed.

Data write as well as reset and shift enable provided on a cell-by-cell basis provides a number of advantages for the SRL. First, stage management control is simplified. With programming using only SRAM configuration memory, even with partial reconfiguration a number of frames must be rewritten, and after programming significant resources are needed to provide state management. However, with individual cell programming capability in an SRL, state management control can be easily provided. As a second advantage, load/store efficiency is significantly increased since only one cell can be rewritten at a time instead of a number of frames at a time. As a third advantage over partial reconfiguration where multiple frames must be written, no formatting/deformatting or address translation is required in connection with a recursive partial bitstream, (i.e. generated and applied within context of state management). As a fourth advantage, FPGA resources are not required separate from SRL circuitry to provide program and read functions for an SRL.

BRIEF DESCRIPTION OF THE DRAWINGS

Further details of the present invention are explained with the help of the attached drawings in which.

DETAILED DESCRIPTION

Figure 1:
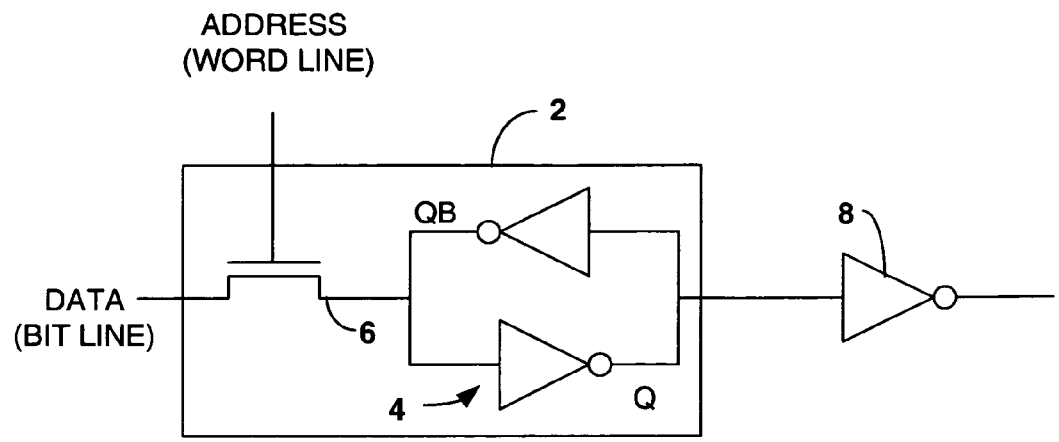
FIG. 1 shows one memory cell structure for use in a LUT.
Figure 2:
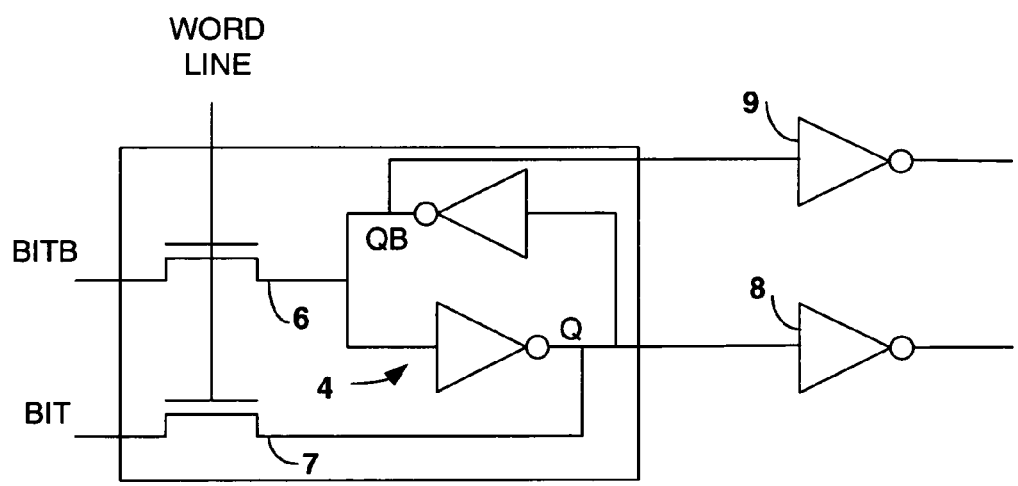
FIG. 2 shows the memory cell structure of FIG. 1 modified to include both complementary programming data inputs and complementary outputs.
Figure 3:
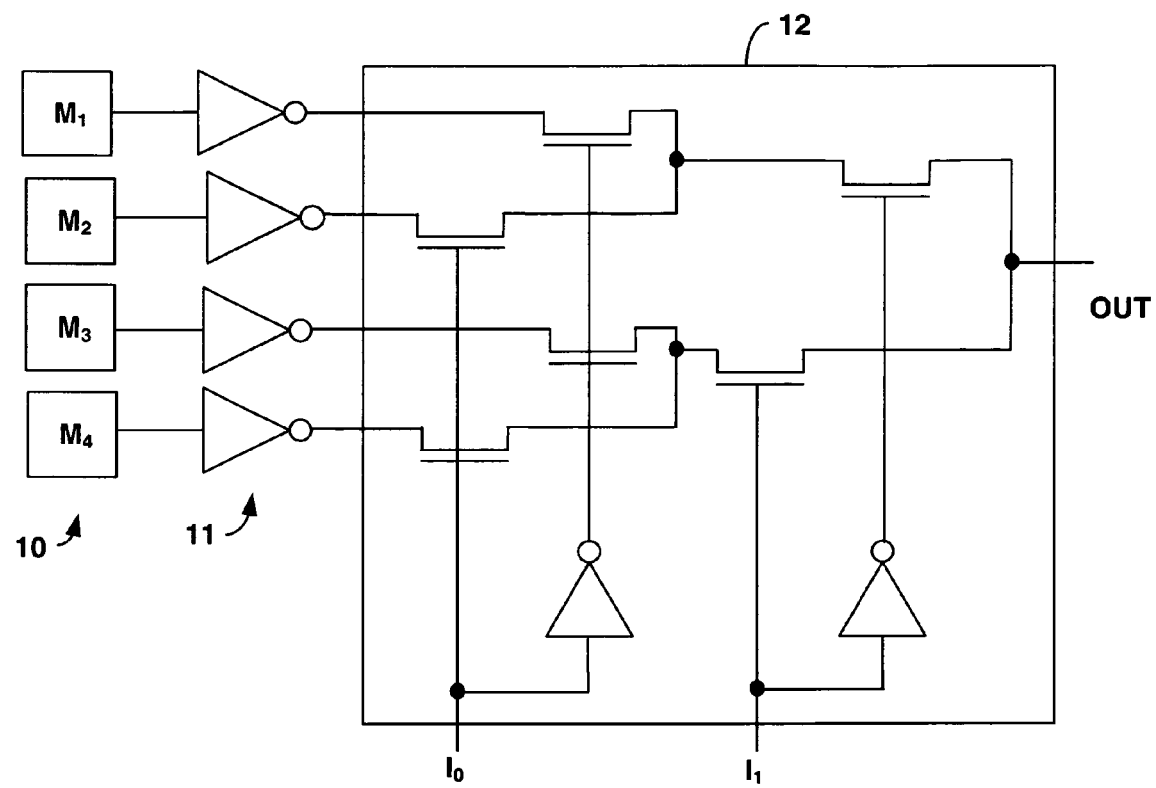
FIG. 3 shows a block diagram of components making up a two input LUT.
Figure 4:
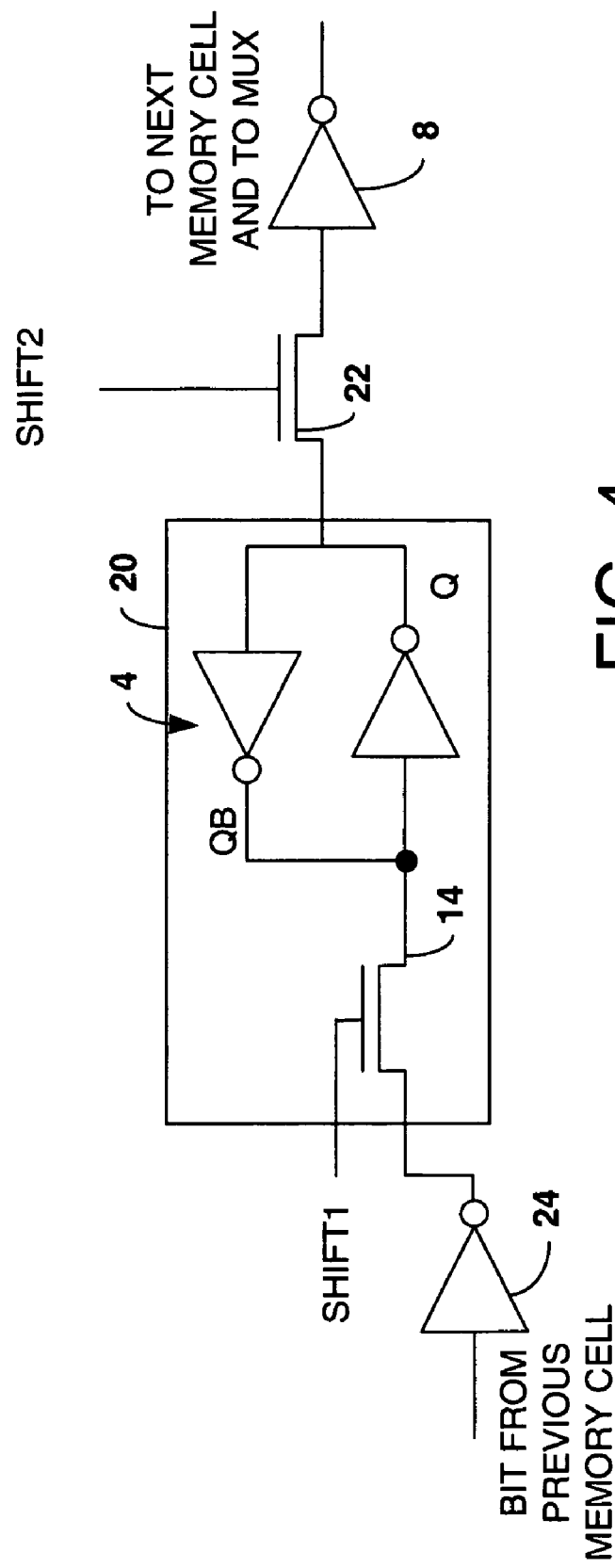
FIG. 4 illustrates circuitry that can be provided with memory cells to create a shift register.
Figure 5:
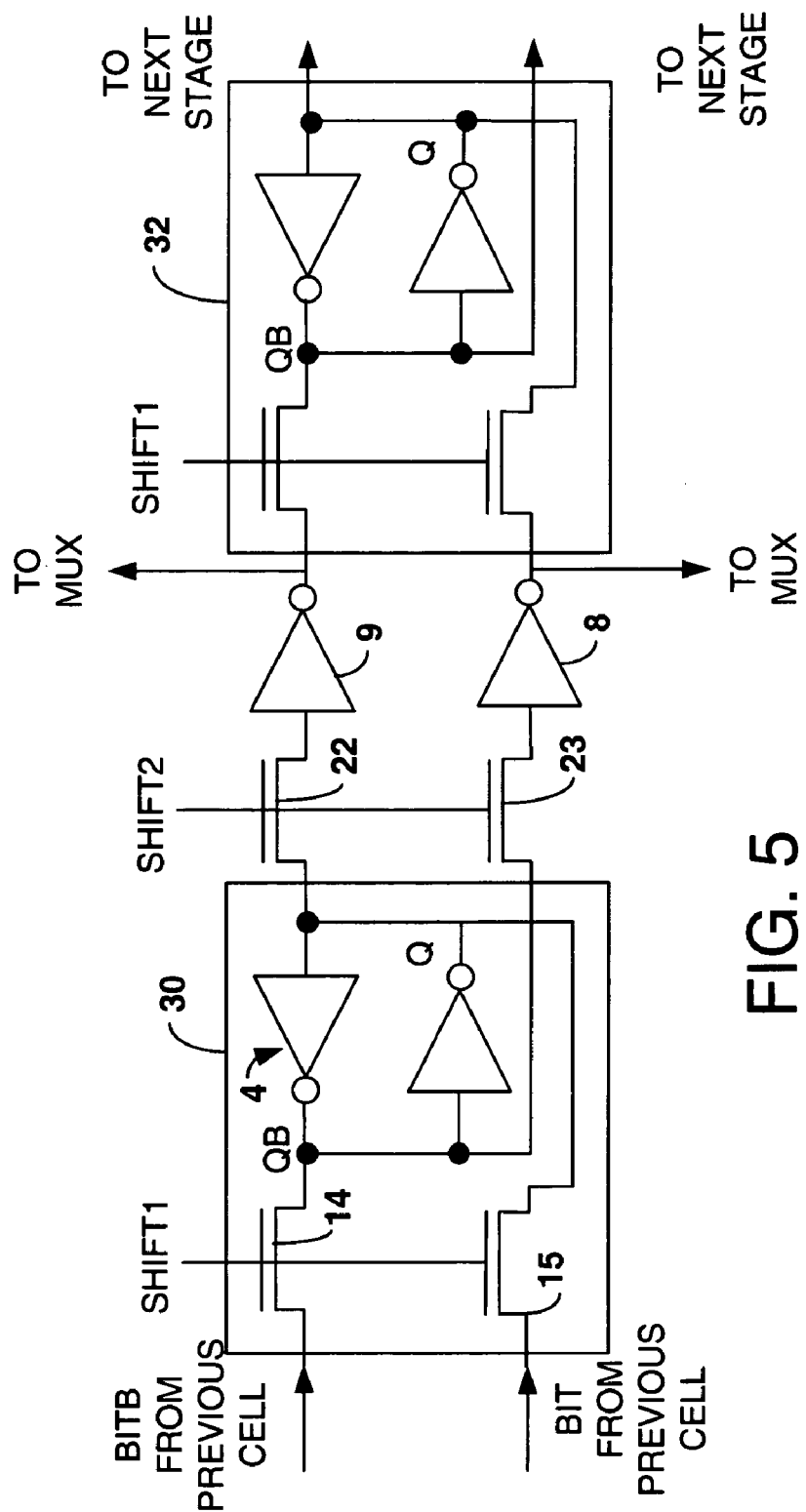
FIG. 5 illustrates LUT memory cells configured to form a shift register, with complementary data being shifted in and out.
Figure 6:
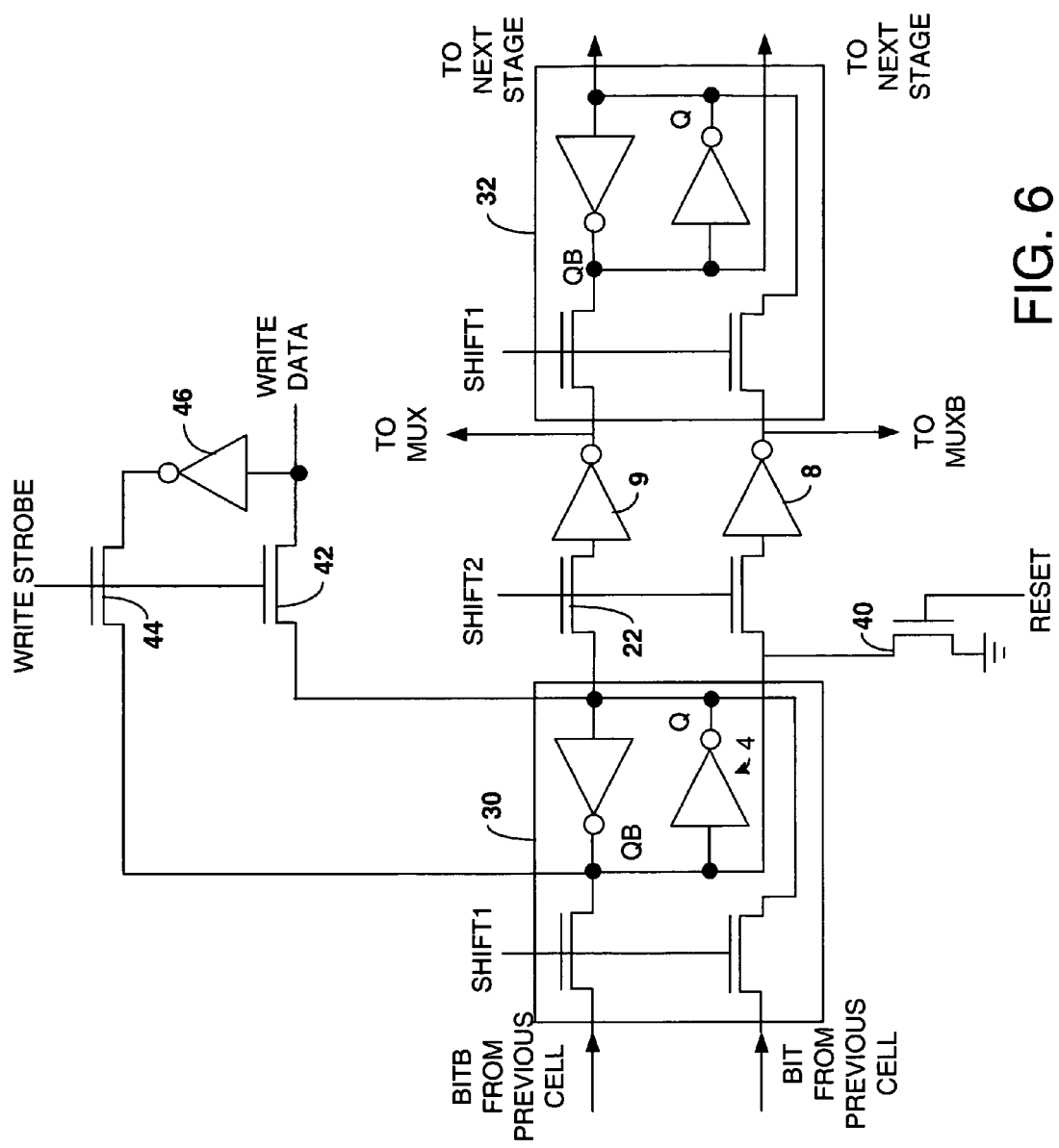
FIG. 6 shows the memory cells connected to form a shift register in FIG. 5 modified in accordance with embodiments of the present invention.

FIG. 6 shows modifications to the memory cells connected to form a shift register in FIG. 5 in accordance with embodiments of the present invention. Initially, the added circuitry includes a pass transistor 40 providing a reset. The transistor 40 is shown with a source-drain path connecting to the QB output of latch 4 to ground. A RESET signal strobe is applied to the gate of transistor 40 causing the latch to be reset to an initial value with QB at ground and Q going high. Although not shown, similar reset transistors can be provided on other stages of the memory cells forming a SRL to reset all the memory cells to an initial value. Although shown connected to the QB output of latch 4, the transistor 40 providing a reset can similarly be connected to the Q output of latch 4 in memory cells connected to form a shift register. Further, although shown with one specific memory cell structure in FIG. 6, combinations of the transistors 42, 44, and 40 and inverter 46 can be provided with other memory cell structures known in the art to provide write and reset functions for an SRL.

Further circuitry is added in FIG. 6 to provide read and write capability. The added components of FIG. 6 include transistors 42 and 44 that are connected to Q and QB inputs of latch 4. Transistor 42 has a source-drain path connecting a WRITE DATA input to the Q input of latch 4, and is activated by a WRITE STROBE applied to its gate. Although transistor 42 could be used alone to program the latch with limited program current, an additional pass transistor 44 is used with a source-drain path connecting the QB input of latch 4 to the WRITE DATA input through an inverter to provide complementary programming signals. Although the write transistors 42, 44 and inverter 46 are shown used with memory cell 30, it is understood that the same circuitry can be used for other memory cell stages forming a shift register where write capability is desired.

Accordingly, FIG. 6 augments the structure of FIG. 5 by introducing an additional WRITE DATA port and an auxiliary RESET. The implementation requires four transistors, including transistors for the inverter 46. The synthesized representation will then include the following ports: (1) RESET, (2) SRL state read, that can be obtained from the MUX and MUXB output signals from each memory cell. (3) SRL state write, that can be provided using the WRITE DATA input, and (4) a write-enable signal, that is provided by the WRITE STROBE signal. This new structure will thus enable full datapath exposure for SRL internal state, (i.e. read/write from/to SRL internal state, and auxiliary reset). Although writing to or reading from SRAM cells typically requires reprogramming one or more frames of memory, the added circuitry of FIG. 6 allows writing and reading to individual memory cells.

Figure 7:
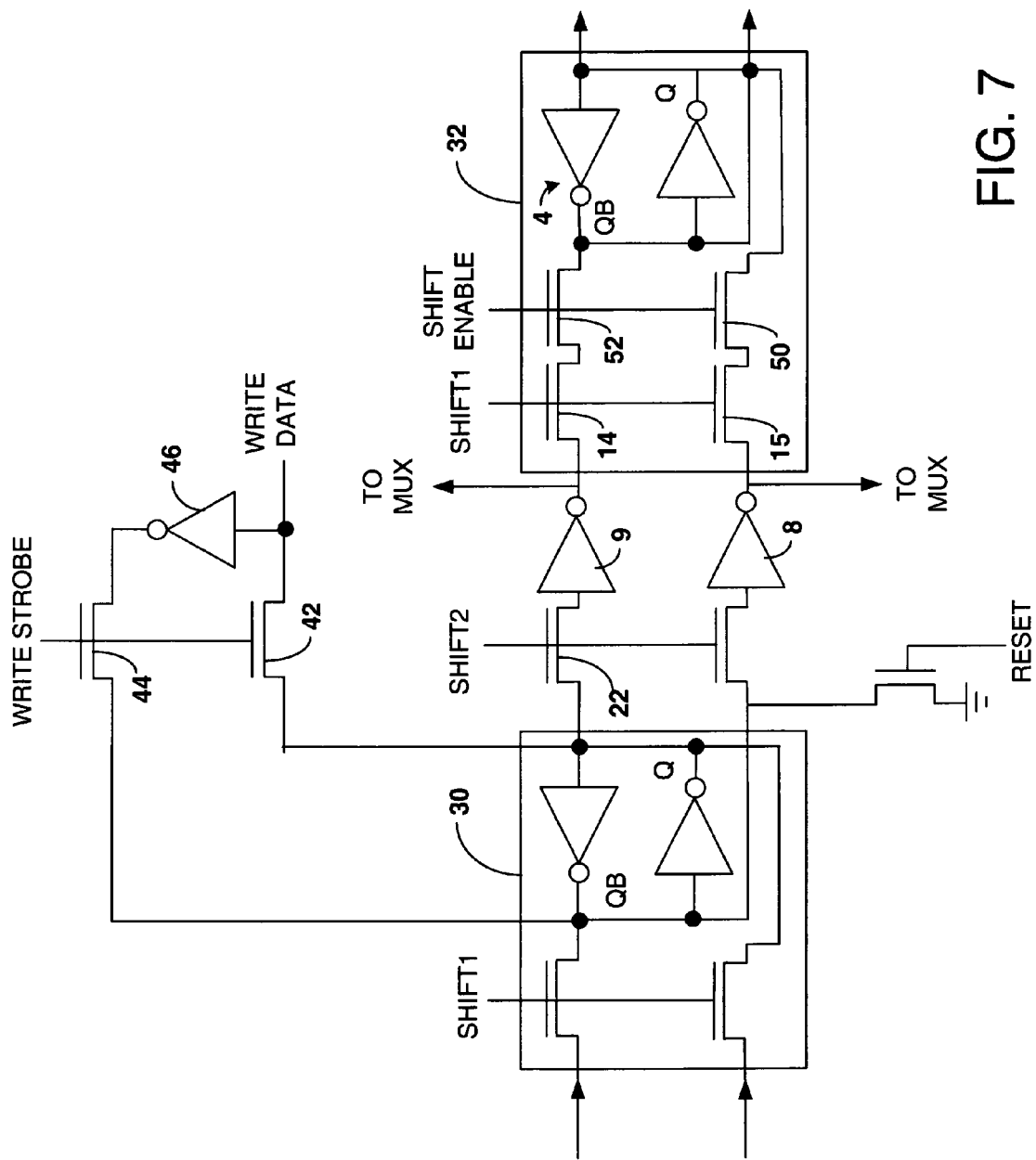
FIG. 7 shows further circuitry that can be added to the components of FIG. 6 to provide a shift enable.

FIG. 7 shows further circuitry that can be added to the components of FIG. 6 to provide a shift enable. The SHIFT1, SHIFT2 and WRITE DATA signals will require synchronization. Synchronization is implemented with external control circuitry (not shown) that can be better facilitated by addition of the shift enable. In one embodiment, shifting will be disabled using the shift enable signal input (SHIFT ENABLE) when reading or writing is performed using the circuitry shown in FIG. 7. The shift enable is provided with pass gate transistors 50 and 52, shown in the memory cell 32. The pass transistor 50 is provided between the output of the shift pass gate 15 and the Q terminal of latch 4. The pass transistor 52 is provided between the output of the shift pass gate 14 and the QB terminal of latch 4. The SHIFT ENABLE signal is then applied to the gate of transistors 50 and 52.

The added transistors 50 and 52 control signals for a SRL state read operation is as follows: (1) logic '0' is applied to SHIFT ENABLE input, (2) data is read/latched from the outputs to the multiplexers MUX and MUXB, and finally (3) a logic '1' is applied to the SHIFT ENABLE input for resumption of normal SRL operation. Similarly, for SRL WRITE the control sequence is: (1) logic '0' is applied to SHIFT ENABLE, (2) logic '1' is applied to WRITE DATA, (3) WRITE STROBE is strobed from logic "0" to logic "1" and back to latch the data, and (5) logic '1' is applied to SHIFT ENABLE for resumption of normal SRL operation. Although the shift enable circuitry transistors 50 and 52 are shown only with memory cell 32, it is understood that similar circuit components can be applied to other memory cells where write and reset are available. Further, as with the circuitry of FIG. 7, it is understood that although shift enable circuitry is shown used with one memory cell structure, similar circuitry can be used with other memory cell structures.

Figure 8:
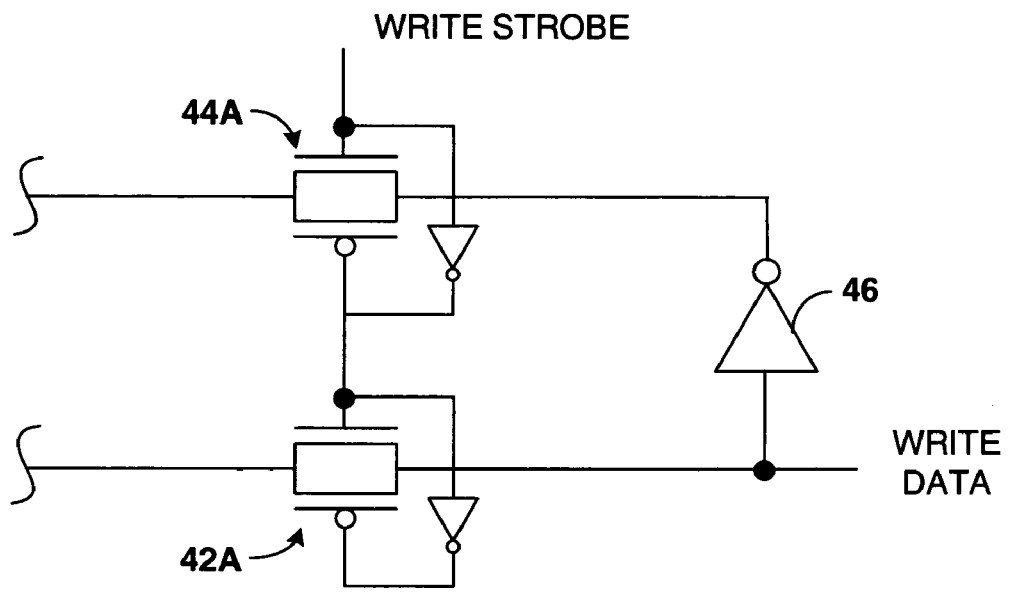
FIG. 8 illustrates an alternative embodiment, where pass gates used in FIGS. 6 and 7 are replaced by transmission gates.

FIG. 8 illustrates an alternative embodiment, where the pass gates in FIGS. 6 and 7, such as pass gates 44 and 42 connected to receive the WRITE STROBE signals, are replaced by transmission gates, such as 44A and 42A. Other pass gates may likewise be replaced, such as the pass gate transistor 22 receiving the SHIFT2 signal. In the particular case of the pass gate transistor 22, it is cut-off at $V_{DD}-V_T$, where $V_{DD}$ is the system power supply and $V_T$ is the threshold voltage of the transistor 22. The following inverter 9 is not strongly driven with a high signal applied through the pass gate 22, so use of a transmission gate might better meet design limits.

Figure 9:
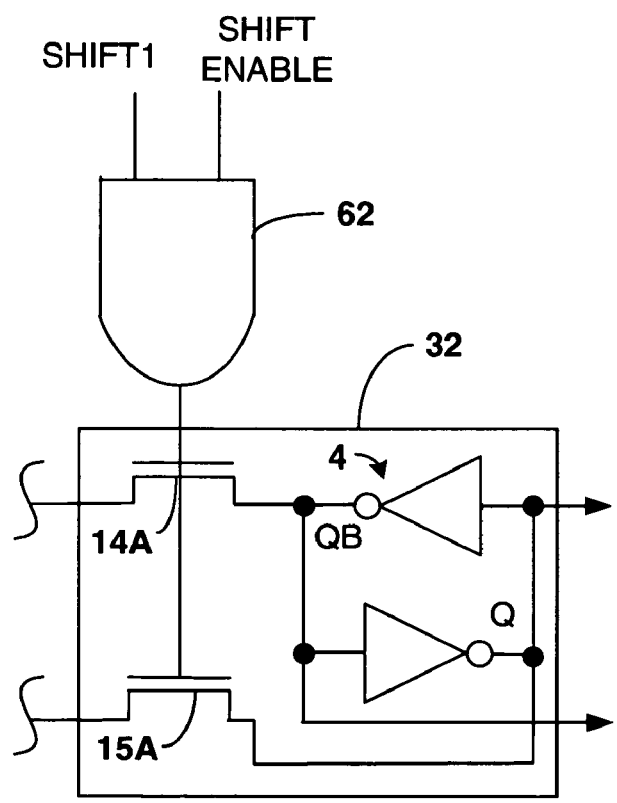
FIG. 9 illustrates another embodiment, where the pass transistors receiving the SHIFT2 and SHIFT_ENABLE signals of FIG. 7 can be provided using an AND gate that drives less pass gates.

FIG. 9 illustrates another embodiment, where the pass transistors 14, 15, 50 and 52 receiving the SHIFT1 and SHIFT_ENABLE signals in FIG. 7 are replaced by pass gates 14A and 15A driven by an AND gate 62. This allows the shift and shift enable signals to be provided on a single input.

Figure 10:
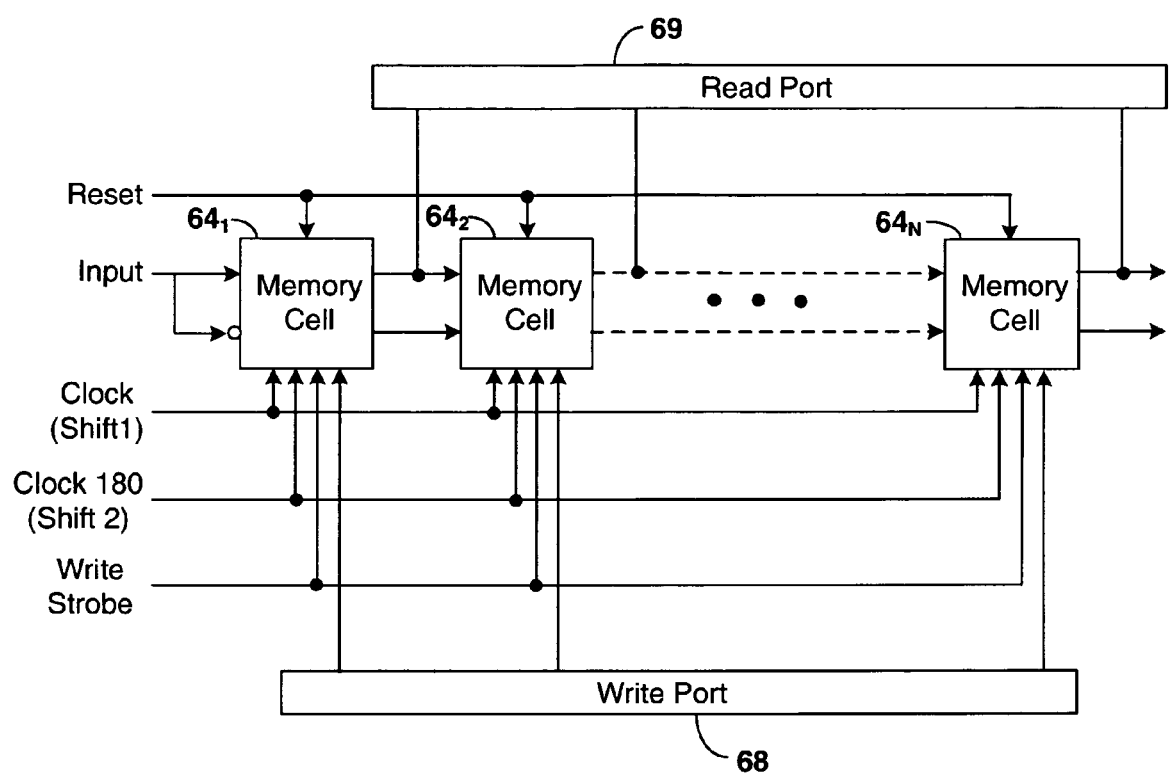
FIG. 10 shows a block diagram illustrating connection of memory cells for a SRL according to embodiments of the present invention.

FIG. 10 provides a block diagram illustrating connection of memory cells for a SRL according to embodiments of the present invention. The memory cells $64_1$-$64_N$ connected to form a shift register include components such as the memory 32 or 30 of FIGS. 6 and 7, as well as components such as the write transistors 22, 40, 42, 44 and inverters 8, 9 and 46 described with respect to embodiments of the present invention. The memory cells $64_1$-$64_N$ receive clock signals 180 degrees out of phase to generate the SHIFT1 and SHIFT2 signals shown in FIGS. 6 and 7. A complementary input signal is applied to the first stage of the shift register formed by the memory cells $64_1$-$64_N$. With embodiments of the present invention, a common reset signal is applied to the memory cells $64_1$-$64_N$. Further with embodiments of the present invention used, a write port 68 is provided to direct write signals along with a write strobe signal (applied to transistors 40 and 42 and inverter 44 in FIGS. 6 and 7) to enable writing data to the memory cells $64_1$-$64_N$. A read buffer 69 is further connected to read the state of the memory cells $64_1$-$64_N$.

Although the present invention has been described above with particularity, this was merely to teach one of ordinary skill in the art how to make and use the invention. Many additional modifications will fall within the scope of the invention, as that scope is defined by the following claims.

What is claimed is:

1. A programmable logic device (PLD) comprising:
   SRAM memory cells connected to components in the PLD, the SRAM memory cells being programmable during operation of the PLD to initially configure logic within the PLD,
   wherein given cells of the SRAM memory cells are interconnected to form a shift register, each given memory cell containing a latch; and
   a write transistor having a source-drain path connecting a terminal for applying write data to the latch of at least one of the given memory cells, the write transistor having a gate with a terminal for applying a write enable signal, wherein the write transistors can be enabled to write data to the given memory cells after the initial configuration of the logic within the PLD.

2. The PLD of claim 1, further comprising:
   a reset transistor having a source-drain path connecting a latch of at least one of the given memory cells to a low voltage terminal.

3. The PLD of claim 1, wherein the write transistor comprises a pass gate.

4. The PLD of claim 1, wherein the write transistor comprises a transmission gate.

5. The PLD of claim 1, further comprising:
   shift register gates having source-drain paths for interconnecting the memory cells to form the shift register, and having gates connected to terminals for applying at least one shift signal; and
   shift register enable gates, each having a source-drain path connecting the source-drain paths of one of the shift register gates between two of the memory cells, the shift register enable gates having a gate terminal for applying a shift enable signal.

6. The PLD of claim 5, wherein the shift register gates comprise pass gates.

7. The PLD of claim 5, wherein the shift register gates comprise transmission gates.

8. The PLD of claim 1, further comprising:
   AND gates, each AND gate having a first input receiving a shift signal, a second input receiving a shift enable signal and providing an outputs; and
   shift gates having source-drain paths for interconnecting the memory cells to form the shift register, the shift gates having gates each being connected to one of the outputs of the AND gates.

9. The PLD of claim 1, further comprising:
   a reset transistor having a source-drain path connecting a latch of at least one of the memory cells to a low voltage terminal;
   shift register gates having source-drain paths for interconnecting the memory cells to form the shift register, and having gates connected to terminals for applying at least one shift signal; and
   shift register enable gates, each having a source-drain path connecting the source-drain paths of one of the shift register gates between two of the memory cells, the shift register enable gates having a gate terminal for applying a shift enable signal.

10. The PLD of claim 1, wherein the source-drain path of the write transistor connects to a true terminal of the latch of the memory cell, and wherein the PLD further comprises:
    an inverter having an input connected to the terminal for applying write data; and
    a complement write transistor having a source-drain path connecting the output of the inverter to a complement terminal of the latch of the at least one memory cell, the complement write transistor having a gate having a terminal for applying a write enable signal.

11. The PLD of claim 1, wherein the PLD comprises an FPGA.

12. The PLD of claim 1, wherein the memory cells are connected to a multiplexer to form a combined shift register and look up table.

13. The PLD of claim 5, wherein the memory cells each comprises only one said latch.

14. A programmable logic device (PLD) comprising:
SRAM memory cells connected to components in the PLD, the SRAM memory cells being programmable during operation of the PLD to initially configure logic within the PLD,
wherein given ones of the SRAM memory cells are interconnected to form a shift register, each given memory cell containing a latch; and
a reset transistor having a source-drain path connecting a latch of at least one of the given memory cells to a low voltage terminal, wherein the reset transistor can be enabled to reset a state of the given memory cells to a desired value after the initial configuration of the logic within the PLD.

15. The PLD of claim 14, further comprising:
shift register gates having source-drain paths for interconnecting the memory cells to form the shift register, and having gates connected to terminals for applying at least one shift signal; and
shift register enable gates, each having a source-drain path connecting the source-drain paths of one of the shift register gates between two of the memory cells, the shift register enable gates having a gate terminal for applying a shift enable signal.

16. The PLD of claim 15, wherein the memory cells each comprise only one said latch.

17. A programmable logic device (PLD) including a shift register look up table (SRL), the SRL having memory cells formed using configuration memory of the PLD, the SRL further having a means for writing a state to the memory cells of the SRL on a cell-by-cell basis after the configuration memory is programmed.

18. The PLD of claim 17, further comprising a means for resetting a state of the memory cells of the SRL on a cell-by-cell basis.

19. The PLD of claim 17, further comprising a means for enabling and disabling shifting of the SRL.

* * * * *